United States Patent
Beasor et al.

(10) Patent No.: US 10,049,944 B2
(45) Date of Patent: Aug. 14, 2018

(54) METHOD OF MANUFACTURING SELECTIVE NANOSTRUCTURES INTO FINFET PROCESS FLOW

(71) Applicant: GLOBALFOUNDRIES Inc., Grand Cayman (KY)

(72) Inventors: Scott Beasor, Greenwich, NY (US); Jeremy A. Wahl, Delmar, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/285,978

(22) Filed: Oct. 5, 2016

(65) Prior Publication Data

US 2018/0096899 A1 Apr. 5, 2018

(51) Int. Cl.

| | |
|---|---|
| *H01L 29/41* | (2006.01) |
| *H01L 21/8238* | (2006.01) |
| *H01L 27/092* | (2006.01) |
| H01L 29/66 | (2006.01) |
| H01L 29/78 | (2006.01) |
| H01L 29/06 | (2006.01) |
| H01L 29/423 | (2006.01) |

(52) U.S. Cl.
CPC ........ *H01L 21/823821* (2013.01); *H01L 21/823807* (2013.01); *H01L 27/0924* (2013.01); *H01L 29/0673* (2013.01); *H01L 29/42392* (2013.01); *H01L 29/6681* (2013.01); *H01L 29/66553* (2013.01); *H01L 29/7851* (2013.01); *H01L 29/7853* (2013.01)

(58) Field of Classification Search
CPC ......... H01L 29/66795; H01L 29/42392; H01L 21/76224
See application file for complete search history.

(56) References Cited

U.S. PATENT DOCUMENTS

| | | | |
|---|---|---|---|
| 6,911,383 B2 | 6/2005 | Doris et al. | |
| 8,580,624 B2 | 11/2013 | Bangsaruntip et al. | |
| 8,709,888 B2 | 4/2014 | Chang et al. | |
| 8,722,472 B2 | 5/2014 | Chang et al. | |
| 9,230,989 B2 | 1/2016 | Chang et al. | |
| 2014/0353735 A1* | 12/2014 | Basker .............. | H01L 29/66795 257/288 |
| 2016/0064288 A1* | 3/2016 | Cheng .................. | H01L 29/165 257/192 |

* cited by examiner

*Primary Examiner* — Thomas L Dickey
(74) *Attorney, Agent, or Firm* — Ditthavong & Steiner, P.C.

(57) ABSTRACT

A method for integrating nanostructures in finFET processing and a related device are provided. Embodiments include forming fins in a Si substrate in first and second device regions; forming STI regions in spaces between fins; forming a first hardmask over the fins and STI regions; removing a portion of the first hardmask over the first device region to expose upper surfaces of the fins and STI regions in the first device region; recessing an upper portion of the fins; forming first devices over the recessed fins; forming a second hardmask over the fins and STI regions; removing a portion of the second hardmask over the second device region to expose upper surfaces of the fins and STI regions; recessing an upper portion of the fins; and forming second devices, different from the first devices, over the recessed fins, wherein the first and/or second devices include nanowire or nanosheet devices.

8 Claims, 13 Drawing Sheets

FIG. 3F

METHOD OF MANUFACTURING SELECTIVE NANOSTRUCTURES INTO FINFET PROCESS FLOW

TECHNICAL FIELD

The present disclosure relates to semiconductor fabrication. In particular, the present disclosure relates to nanostructures integrated into fin field effect transistor (finFET) fabrication in the 7 nanometer technology nodes and beyond.

BACKGROUND

As the semiconductor field continues to drive enhancements to circuit density scaling, new channel architectures are becoming more relevant. One of the existing ways to extend silicon is horizontal gate all around (hGAA) nanowires. Early hGAA device readouts indicate improved short channel drain induced barrier lowering (DIBL) and subthreshold slope (SS) performance versus finFET lots. Further, decent saturation threshold voltage (Vtsat)—ion performance is achieved with hGAA devices which is on the same trend line as finFET. Moreover, there is no apparent resistance degradation compared with finFET. However, despite the benefits, existing hGAA technology has been focused on unipolar devices.

Currently, there are no nanowire integration schemes that support different nanowire stacks to support multiple devices, and there is no existing complementary metal-oxide-semiconductor (CMOS) integration of multiple nanowires.

A need therefore exists for methodology enabling CMOS integration of multiple nanowires to maximize device offering capability and the resulting devices.

SUMMARY

An aspect of the present disclosure is an integration scheme that supports different nanowire stacks to support multiple devices. Another aspect includes a manufacturable selective gate all around (GAA) nanostructure integration scheme that enables GAA nanostructures (e.g., nanowire and nanosheets) with finFETs, with replacement fins and/or multiple nanowire/nanosheet channel materials to support different devices and to provide a true CMOS GAA nanowire/nanosheet solution. Yet another aspect of the present disclosure includes leveraging replacement fin integration scheme for CMOS capability of different nanowire stack growth to optimize n-channel FET (NFET) and p-channel FET (PFET) performance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method that includes forming fins in a silicon (Si) substrate in first and second device regions of the Si substrate; forming shallow trench isolation (STI) regions in spaces between adjacent fins; forming a first hardmask over the fins and STI regions; removing a portion of the first hardmask over the first device region to expose upper surfaces of the fins and STI regions in the first device region; recessing an upper portion of the fins in the first device region; forming first devices over the recessed fins; forming a second hardmask over the fins and STI regions; removing a portion of the second hardmask over the second device region to expose upper surfaces of the fins and STI regions in the second device region; recessing an upper portion of the fins in the second device region; and forming second devices, different from the first devices, over the recessed fins, wherein the first and/or second devices include nanostructure devices including nanowires or nanosheets. Aspects include forming more than two devices including nanowires or nanosheets.

Aspects of the present disclosure include forming the STI regions with an oxide; and planarizing the oxide with chemical mechanical polishing (CMP) to form the STI regions between the fins. Other aspects include forming the first devices by forming nanostacks selected from nanowires or nanosheets and the second devices include finFETs. Another aspect includes forming the nanostacks by forming a first sacrificial silicon germanium (SiGe) layer over the recessed fins; forming a first Si nanowire or nanosheet material over the first sacrificial SiGe layer; forming a second sacrificial SiGe layer over the first Si nanowire or nanosheet material; and forming a second Si nanowire or nanosheet material over the second sacrificial SiGe layer. Other aspects include forming well implants on sides of the fins. Certain aspects include forming a photoresist layer over each hardmask; and patterning the photoresist layer before removing the portion of the hardmask. Yet other aspects include forming the first devices by forming a replacement fin growth over each recessed fins in the first device region; and forming the second devices by forming nanowire or nanosheet stacks over the recessed fins in the second device region. Aspects include forming the nanowire or nanosheet stacks by forming a first sacrificial SiGe layer over the recessed fins; forming a first Si nanowire or nanosheet material over the first sacrificial SiGe layer; forming a second sacrificial SiGe layer over the first Si nanowire or nanosheet material; and forming a second Si nanowire or nanosheet material over the second sacrificial SiGe layer. Other aspects include forming the first devices by forming first nanowire or nanosheet stacks over the recessed fins in the first device region; and forming the second devices by forming second nanowire or nanosheet stacks over the recessed fins in the second device region, the first nanowire or nanosheet stacks including materials different from the second nanowire or nanosheet stacks. Other aspects include forming each of the first and second nanowire or nanosheet stacks by forming a first sacrificial SiGe layer over the recessed fins; forming a first Si nanowire or nanosheet material over the first sacrificial SiGe layer; forming a second sacrificial SiGe layer over the first Si nanowire or nanosheet material; and forming a second Si nanowire or nanosheet material over the second sacrificial SiGe layer.

According to the present disclosure, other technical effects may be achieved in part by a device including a semiconductor die; first devices in a first region of the semiconductor die; and second devices different from the first devices in a second region of the semiconductor die, wherein the first and/or second devices include nanowire or nanosheet devices.

Aspects include STI regions including an oxide; and fins formed between the STI regions. Other aspects include well implants formed on sides of the fins. Additional aspects include each nanowire or nanosheet device including a nanowire or nanosheet stack formed as an upper portion of the fins, each nanowire or nanosheet stack including a first sacrificial SiGe layer formed over the fins; a first Si nanowire or nanosheet material formed over the first sacrificial SiGe layer; a second sacrificial SiGe layer formed over the first Si nanowire or nanosheet material; and a second Si nanowire or nanosheet material formed over the second sacrificial SiGe layer. Other aspects include the first devices having the nanowire or nanosheet stacks and the second devices including finFETs. Additional aspects include the first devices including nanowire or nanosheet stacks in the first region; and the second devices including nanowire or nanosheet stacks in the second region, wherein the nanowire or nanosheet stacks in the first and second device regions are formed of different materials. Other aspects include the first devices including a replacement fin growth over each fin in the first region; and the second devices including the nanowire or nanosheet stacks over the fins in the second region. Certain aspects include the first and second nanowire or nanosheet materials including Si or SiGe. Other aspects include the first and second sacrificial layers including SiGe, wherein the Ge content is higher in the first and second sacrificial layers than the Ge content in the first and second nanowire or nanosheet materials.

According to the present disclosure, some additional technical effects may be achieved in part by a method including: forming fins in a Si substrate in first and second device regions of the Si substrate; forming STI regions in spaces between adjacent fins; forming a first hardmask over the fins and STI regions; removing a portion of the first hardmask over the first device region to expose upper surfaces of the fins and STI regions in the first device region; recessing an upper portion of the fins in the first device region; forming first devices over the recessed fins; forming a second hardmask over the fins and STI regions; removing a portion of the second hardmask over the second device region to expose upper surfaces of the fins and STI regions in the second device region; and forming second devices, different from the first devices, over the recessed fins, wherein the first and/or second devices include nanowire or nanosheet devices, wherein each nanowire or nanosheet device includes a nanowire or nanosheet stack formed as an upper portion of the fins, each nanowire or nanosheet stack including: a first sacrificial SiGe layer formed over the fins; a first Si nanowire or nanosheet material formed over the first sacrificial SiGe layer; a second sacrificial SiGe layer formed over the first Si nanowire or nanosheet material; and a second Si nanowire or nanosheet material formed over the second sacrificial SiGe layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limited applicability of nanowire or nanosheet integration schemes in unipolar devices. In accordance with embodiments of the present disclosure, CMOS integration of multiple nanowires or nanosheets to maximize device offering capability and the resulting devices are provided. In certain embodiments, the number of nanowires or nanosheets, nanowire or nanosheet diameter and nanowire or nanosheet space are variables and can be adjusted based on device requirements. Moreover, with different channel materials/options, the process can be tuned to provide optimal device performance (i.e. strain of channel, film composition/characteristic, etc.) for NFET and PFET devices. With the present disclosure, the integration scheme is simplified and the processing cost is reduced since existing fin patterning and STI flow are followed and only an additional recess patterning etch module is added. In accordance with embodiments of the present disclosure, multiple trench recess fill materials remain supported with the present process flow.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
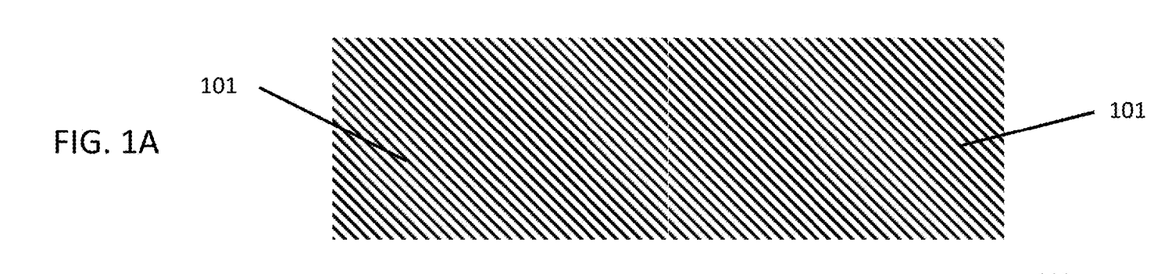
FIGS. 1A through 1R illustrate cross sectional views of a process flow to produce selective GAA nanowires with fin preservation, in accordance with an exemplary embodiment.
Figure 1B:
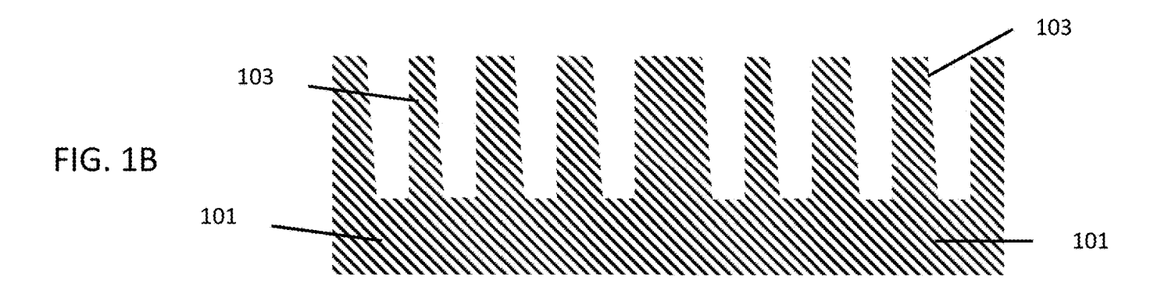
Figure 1C:
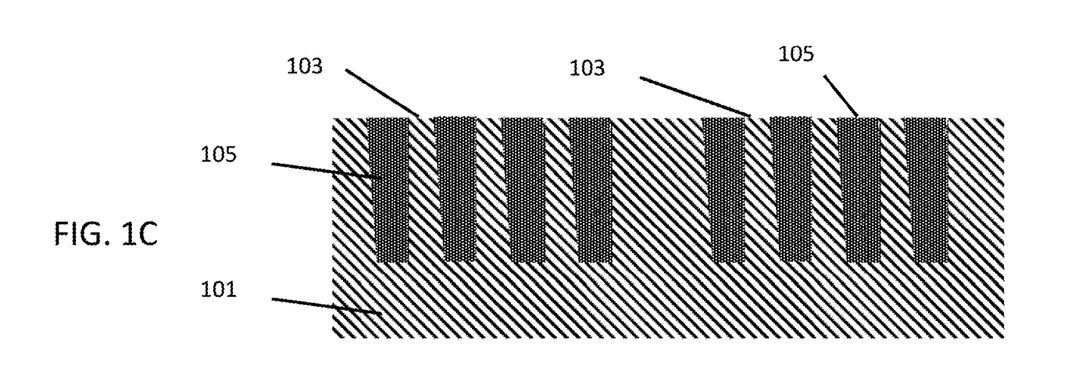

Adverting to FIG. 1A, a Si bulk substrate 101 is provided. Examples of materials that may be suitable for use in the substrate include silicon-on-insulator (SOI), silicon-germanium (SiGe), germanium, and/or compound semiconductor materials. Processes, such as photolithography and etch processes, can be used to create the fins 103, as illustrated in FIG. 1B. The cross-sectional views in FIGS. 1A through 1I are perpendicular to the fins 103. The fins 103 are formed of the Si material of the substrate 101 with trenches formed between adjacent fins 103. The fins 103 include the channels of a finFET and will be coupled to the source/drain regions of the finFET. FinFETs use a substantially rectangular fin structure. For example, silicon on a substrate is etched into a rectangular fin shape by first patterning and depositing a hardmask on the bulk silicon. The hardmask forms a pattern covering the top of the fins 103. The silicon is then etched to form trenches between the regions covered by the hardmask. As shown in FIG. 1C, the trenches are formed into STI regions 105 by depositing a dielectric material such as silicon oxide. The STI regions are subjected to chemical mechanical polishing (CMP) to remove excess dielectric material.

Figure 1D:
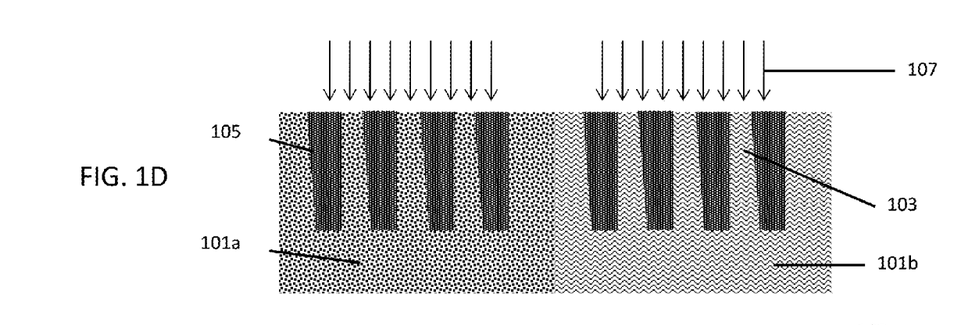
Figure 1E:
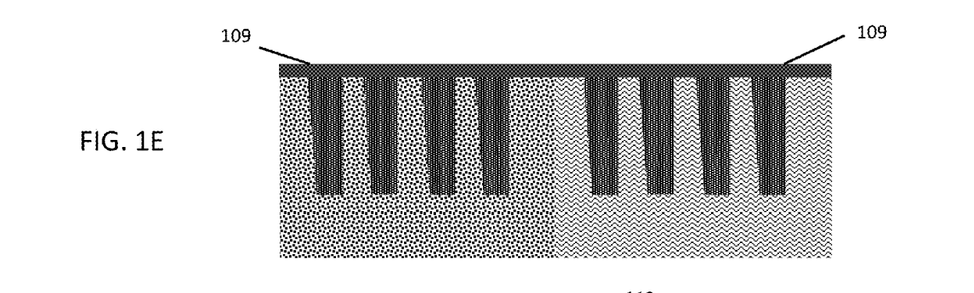
Figure 1F:
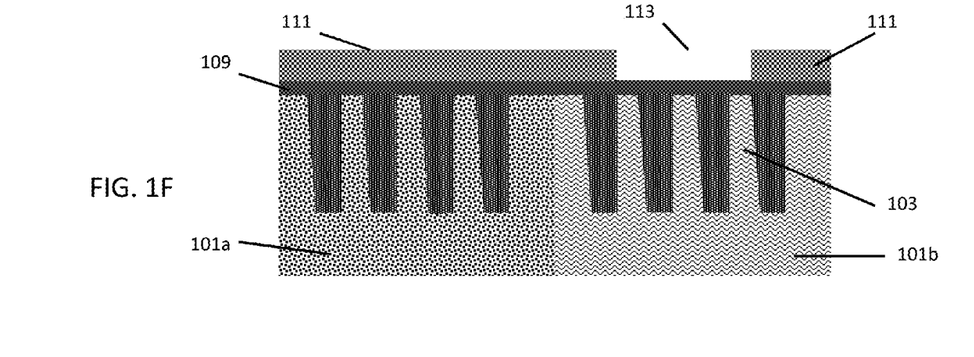
Figure 1G:
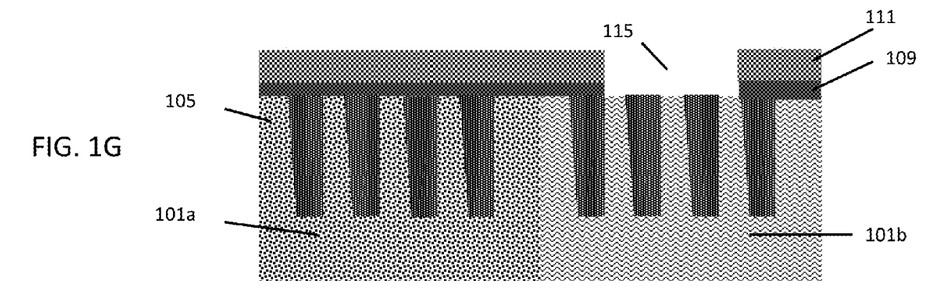

Adverting to FIG. 1D, well implants 107 are introduced. Implants 107 can be performed before fin 103 patterning or after fin patterning, STI fill and CMP. Substrate region 101a is designated for a finFET device and substrate region 101b is designated for a nanowire or nanosheet device. In FIG. 1E, a hardmask 109 is deposited over the upper surfaces of the fins 103 and STI regions 105. In FIG. 1F, a photoresist layer 111 is deposited over the hardmask 109 and patterned to form opening 113 over fins 103 in substrate region 101b. In FIG. 1G, a hardmask etching step is performed to remove a portion of the exposed hardmask 109 and form opening 115. The photoresist layer 111 is subsequently removed.

Figure 1H:
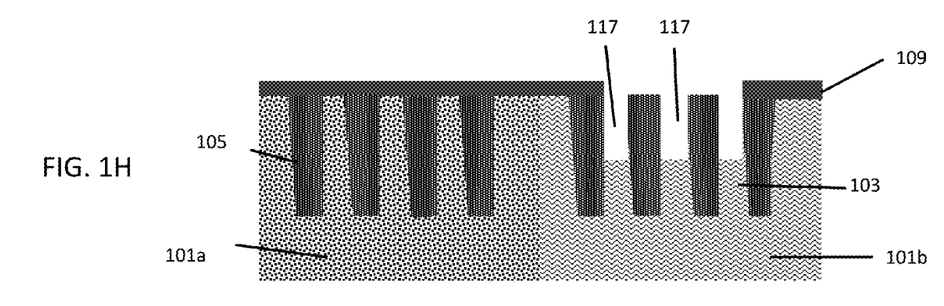
Figure 1I:
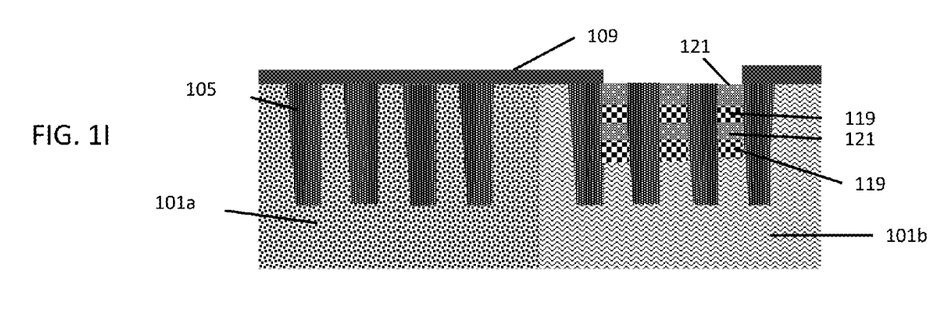

Adverting to FIG. 1H, fins 103 in substrate region 101b are etched back to form recessed regions 117. In FIG. 1I, a nanowire or nanosheet stack is formed in recessed regions 117. The nanowire or nanosheet stack is composed of alternating layers of sacrificial SiGe layers 119 and Si nanowire or nanosheet material 121. The Si nanowire or nanosheet material can include Si or SiGe. The sacrificial SiGe layers 119 have a higher Ge % than the Ge present in nanowire or nanosheet material 121. The hardmask 109 is subsequently removed.

Figure 1J:
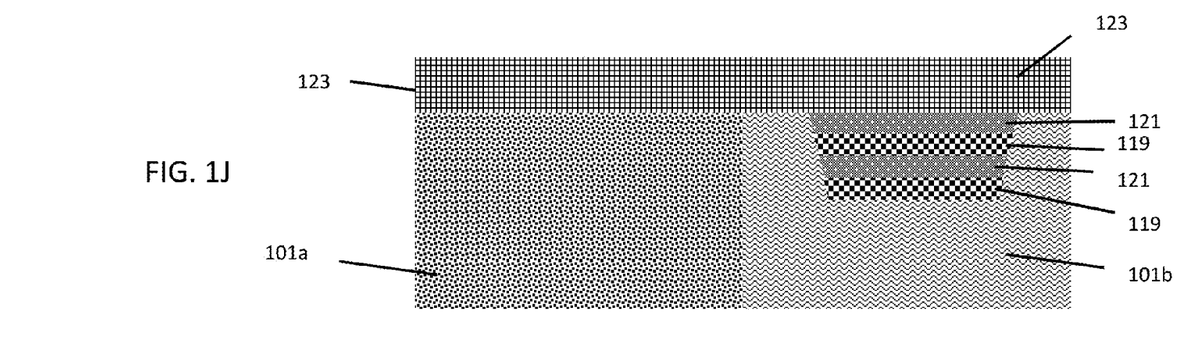
Figure 1K:
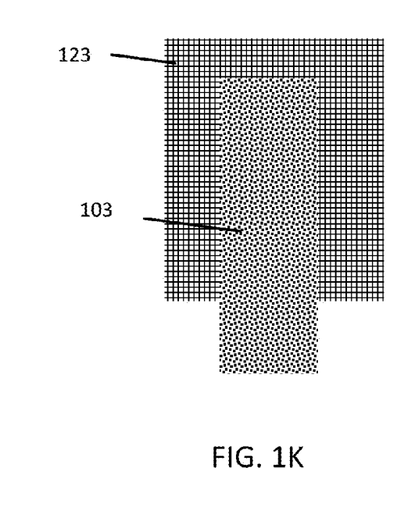
Figure 1L:
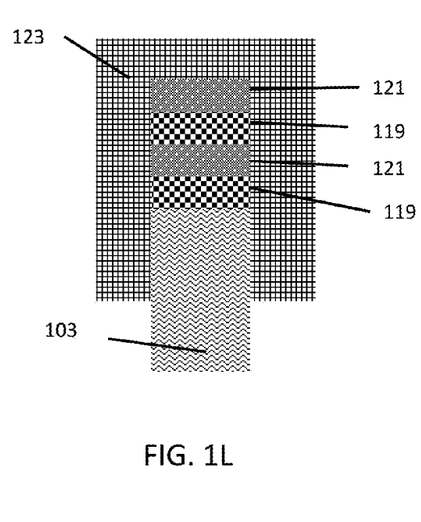

Following the formation of the nanowire or nanosheet stack, the finFET and nanowire or nanosheet devices in substrate regions 101a and 101b undergo additional processing. FIG. 1J illustrates a Y-direction cut that is parallel through the fins, and depicts a dummy gate layer 123 that is formed and patterned over the fins contained in substrate regions 101a and 101b. FIGS. 1K and 1L illustrate a X-direction cut of the regions 101a and 101b, respectively, which is perpendicular through the fins 103 and dummy gate 123. Gate implants can then be performed.

Figure 1M:
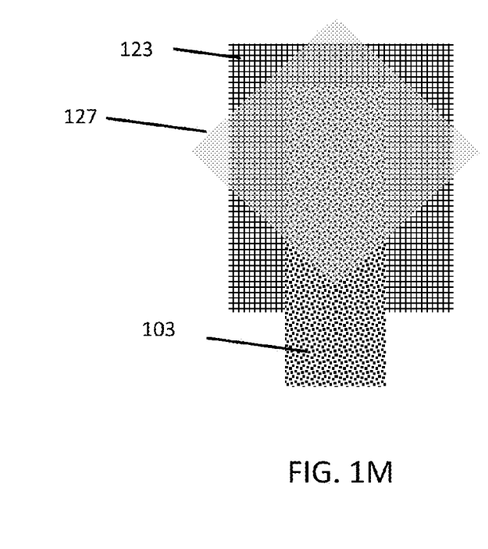
Figure 1N:
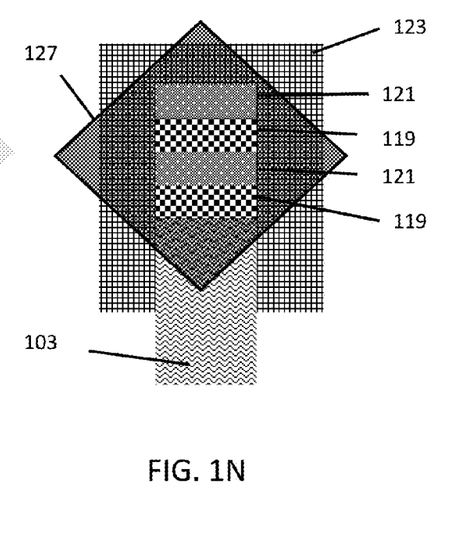
Figure 1O:
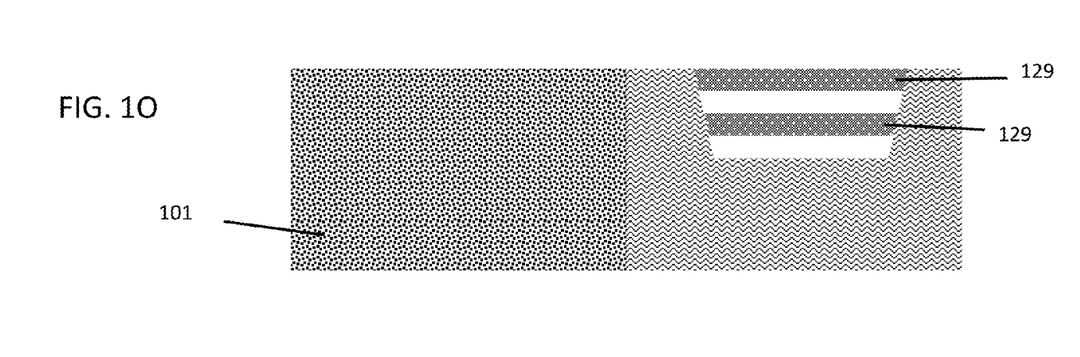
Figure 1P:
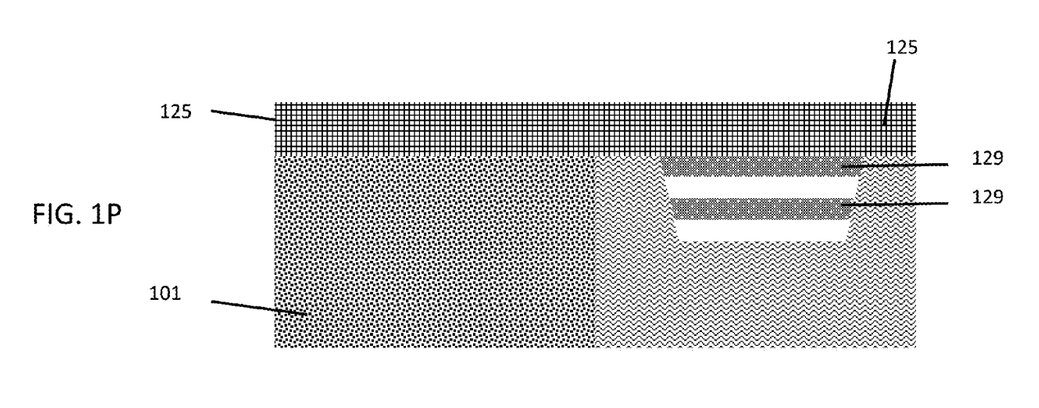
Figure 1Q:
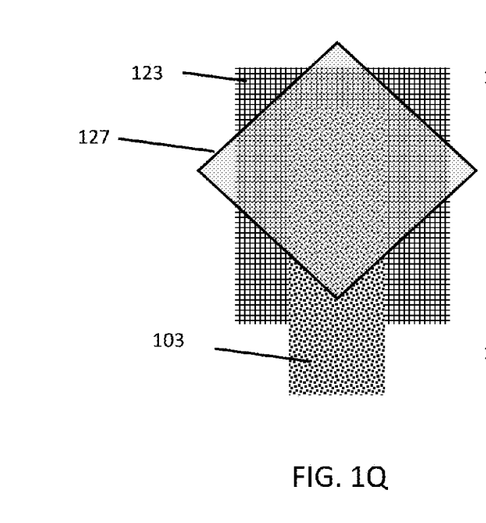
Figure 1R:
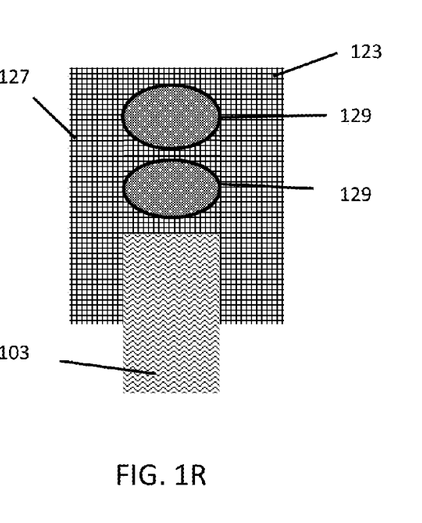

Source/drain (S/D) epitaxial junctions 127 are then formed, as illustrated in FIGS. 1M and 1N. FIGS. 1M and 1N are X-directional cuts which are perpendicular through the fins 103 and dummy gate 123. In FIG. 1O, the dummy gate layer 123 is removed following the formation of the S/D epitaxial junctions 127. A nanowire or nanosheet release can then be performed and permits the release of different nanowires or nanosheets at one time. For example, the sacrificial SiGe layers 119 can be released, resulting in nanowire or nanosheet regions 129. In FIG. 1P, a high-K metal gate (HKMG) stack 125 is formed over the fins followed by middle of line (MOL) or back end of line (BEOL) processing. FIGS. 1Q and 1R illustrate X-direction cuts which are perpendicular to the fins 103 and gate 125 and depict HKMG stack 125 over fins 103.

Figure 2A:
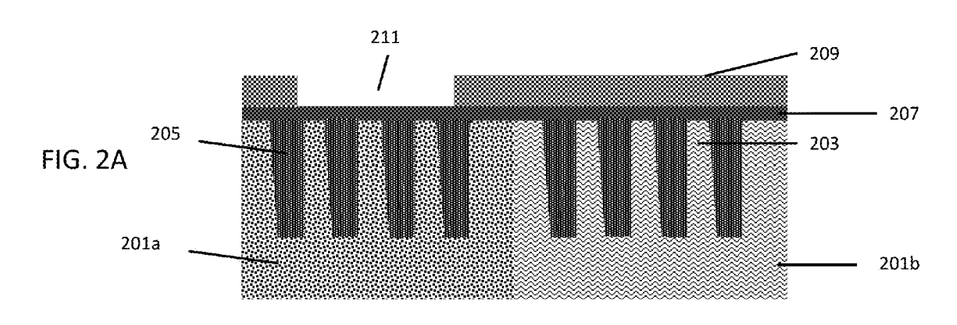
FIGS. 2A through 2I illustrate cross sectional views of a process flow to produce selective GAA nanowires or nanosheets with selective replacement fin growth, in accordance with another exemplary embodiment.
Figure 2B:
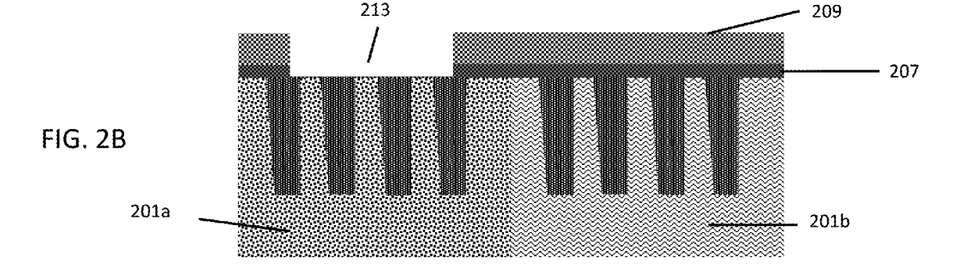

FIGS. 2A through 2I illustrate the process flow of another embodiment of the present disclosure. In particular, FIGS. 2A through 2I illustrate cross sectional views of a process flow to produce selective GAA nanowires or nanosheets with selective replacement fin growth. In FIG. 2A, the substrate regions 201a and 201b are illustrated in cross-section and depict fins 203 and STI regions 205 formed in a substantially similar manner as described above for FIGS. 1A through 1E. In FIG. 2A, a hardmask 207 is deposited over the upper surfaces of the fins 203 and STI regions 205. A photoresist layer 209 is deposited over the hardmask 207 and patterned to form opening 211 over fins 203 in substrate region 201a. In FIG. 2B, a hardmask etching step is performed to remove a portion of the exposed hardmask 207 and form opening 213. The photoresist layer 209 is subsequently removed.

Figure 2C:
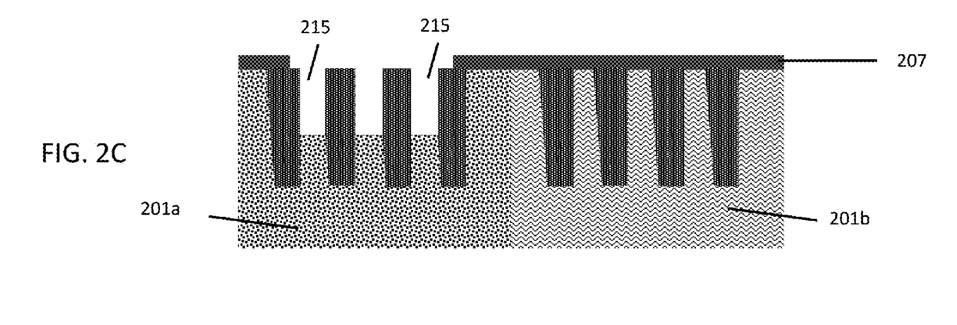
Figure 2D:
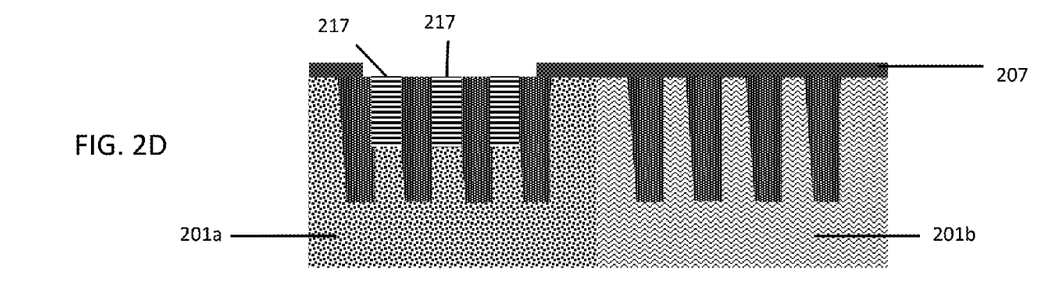
Figure 2E:
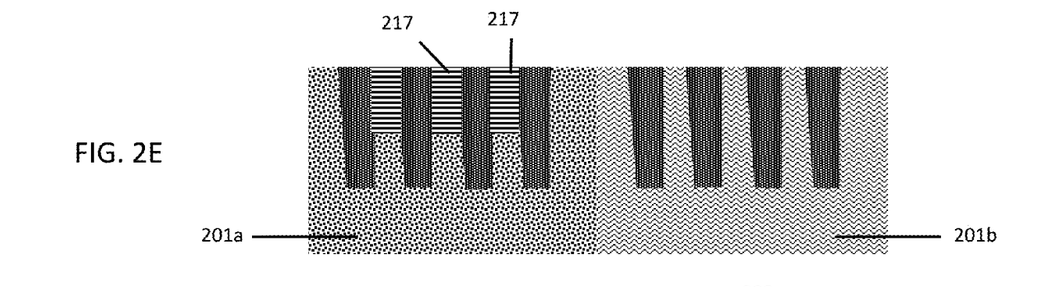
Figure 2F:
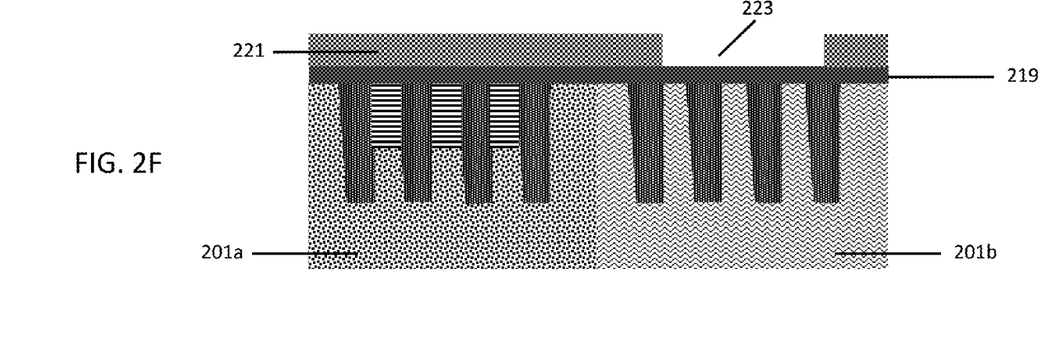
Figure 2G:
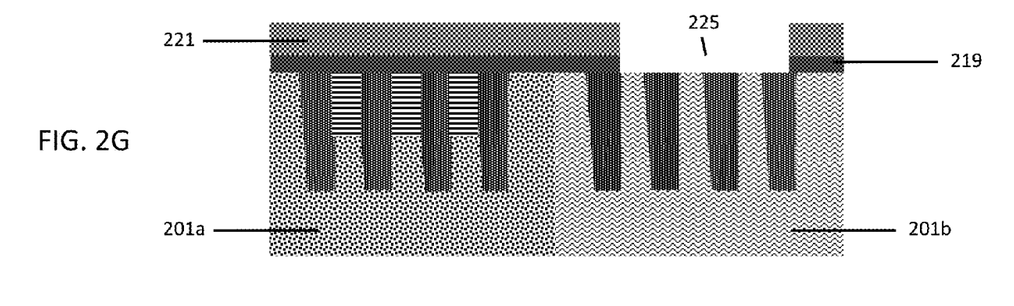

Adverting to FIG. 2C, fins 203 in substrate region 201a are etched back to form recessed regions 215. In FIG. 2D, a replacement fin growth 217 is formed in recessed regions 215. The replacement fin growth 217 is composed of Si or SiGe material. The hardmask 207 is subsequently removed, as illustrated in FIG. 2E. Adverting to FIG. 2F, another hardmask 219 is deposited, and a photoresist layer 221 is formed over the hardmask 219 and patterned to form opening 223 over substrate region 201b. In FIG. 2G, a hardmask etch is performed to form opening 225. The photoresist layer 221 is subsequently removed.

Figure 2H:
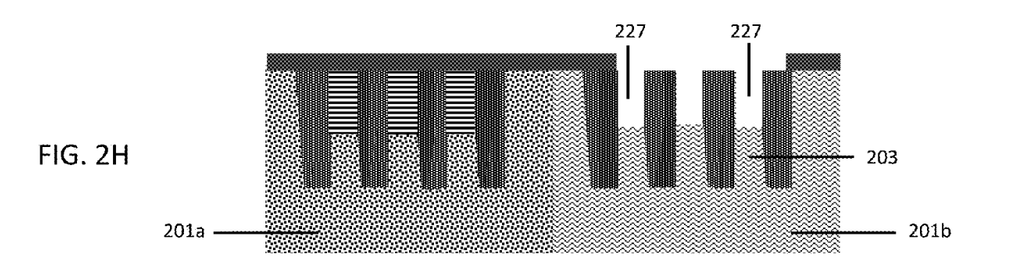
Figure 2I:
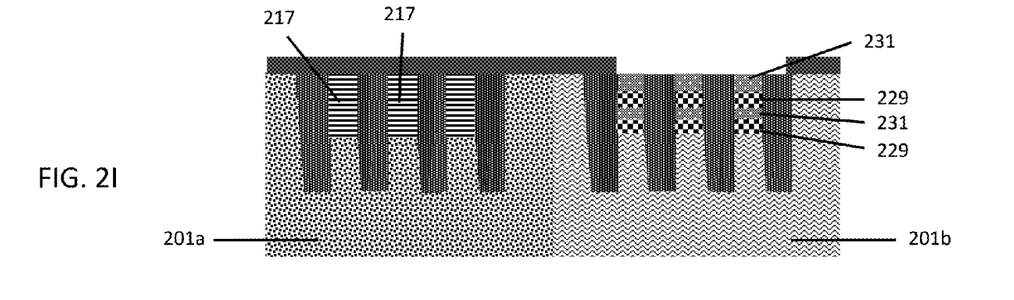

Adverting to FIG. 2H, fins 203 in substrate region 201b are etched back to form recessed regions 227. In FIG. 2I, a nanowire or nanosheet stack is formed in recessed regions 227. The nanowire or nanosheet stack is composed of alternating layers of sacrificial SiGe layers 229 and Si nanowire or nanosheet material 231. The Si nanowire or nanosheet material can include Si or SiGe. The sacrificial SiGe layers 229 have a higher Ge % than the Ge present in nanowire or nanosheet material 231. The hardmask 219 is subsequently removed. Following the nanowire or nanosheet stack growth, additional processing such as dummy gate formation, S/D junction formation, dummy gate removal, nanowire or nanosheet release and HKMG stack formation can be performed similar to that described above for FIGS. 1J through 1R.

Figure 3A:
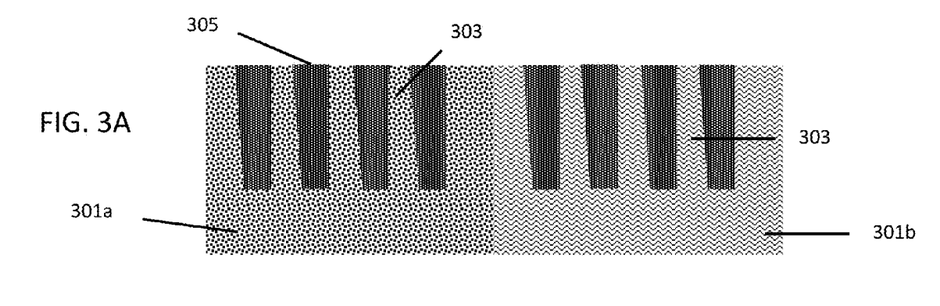
FIGS. 3A through 3K illustrate cross sectional views of a process flow to produce selective GAA nanowires or nanosheets with different materials, in accordance with yet another exemplary embodiment.
Figure 3B:
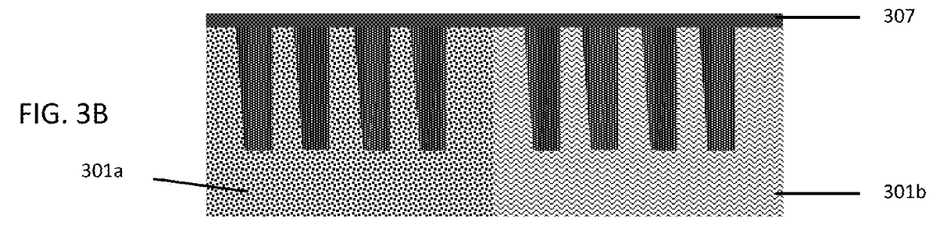
Figure 3C:
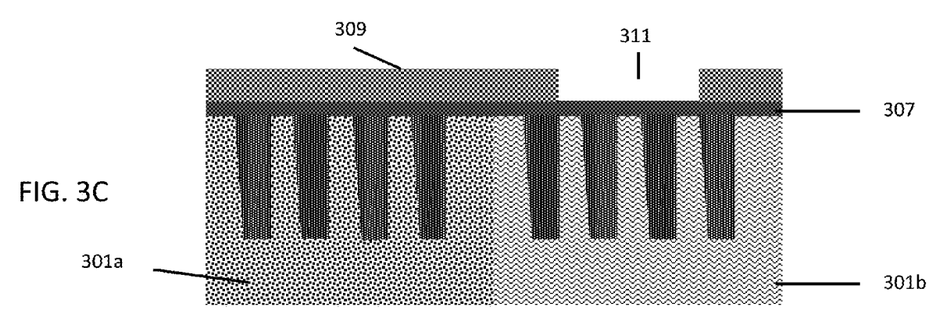
Figure 3D:
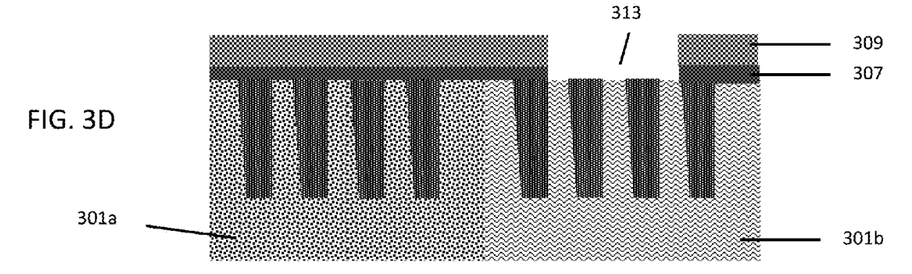

FIGS. 3A through 3K illustrate the process flow of yet another embodiment of the present disclosure. In particular, FIGS. 3A through 3K illustrate cross sectional views of a process flow to produce selective GAA nanowires or nanosheets with different materials. Adverting to FIG. 3A, the substrate regions 301a and 301b depict fins 303 and STI regions 305 formed in a substantially similar manner as described above for FIGS. 1A through 1E. In FIG. 3B, a hardmask 307 is deposited over the upper surfaces of the fins 303 and STI regions 305. In FIG. 3C, a photoresist layer 309 is deposited over the hardmask 307 and patterned to form opening 311 over fins 303 in substrate region 301b. In FIG. 3D, a hardmask etching step is performed to remove a portion of the exposed hardmask 307 and form opening 313. The photoresist layer 309 is subsequently removed.

Figure 3E:
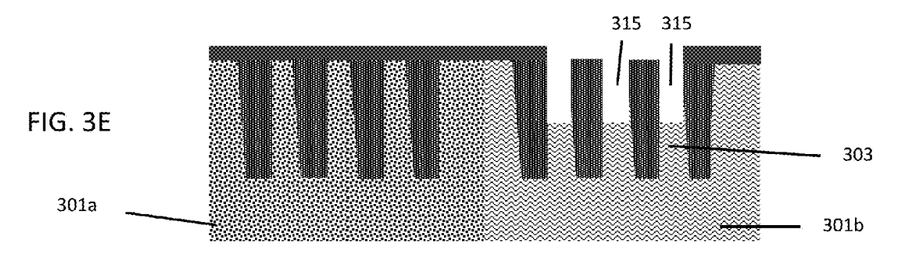
Figure 3F:
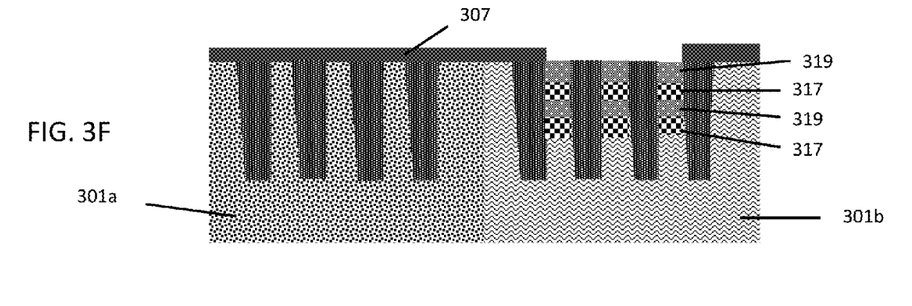
Figure 3G:
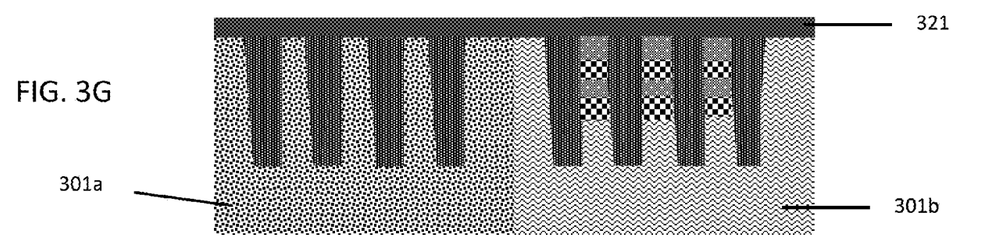
Figure 3H:
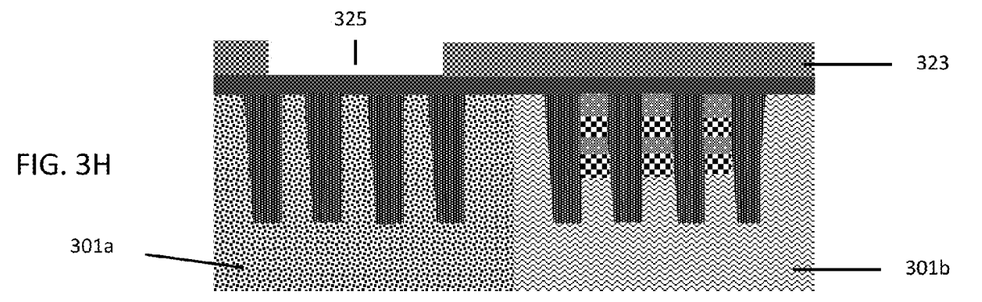
Figure 3I:
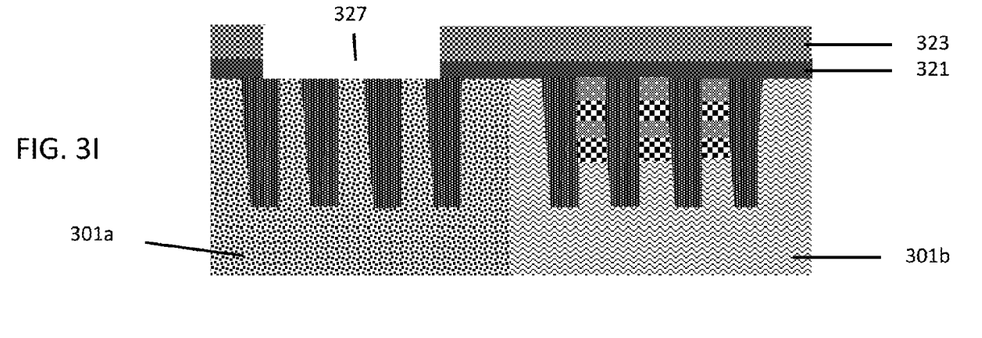

Adverting to FIG. 3E, fins 303 in substrate region 301b are etched back to form recessed regions 315. In FIG. 3F, a nanowire or nanosheet stack is formed in recessed regions 315. The nanowire or nanosheet stack is composed of alternating layers of sacrificial SiGe layers 317 and Si nanowire or nanosheet material 319. The Si nanowire or nanosheet material can include Si or SiGe. The sacrificial SiGe layers 317 have a higher Ge % than the Ge present in nanowire or nanosheet material 319. The hardmask 307 is subsequently removed. Adverting to FIG. 3G, another hardmask 321 is deposited, and a photoresist layer 323 is formed over the hardmask 321 and patterned to form opening 325 over substrate region 301a. In FIG. 3I, a hardmask etch is performed to form opening 327. The photoresist layer 323 is subsequently removed.

Figure 3J:
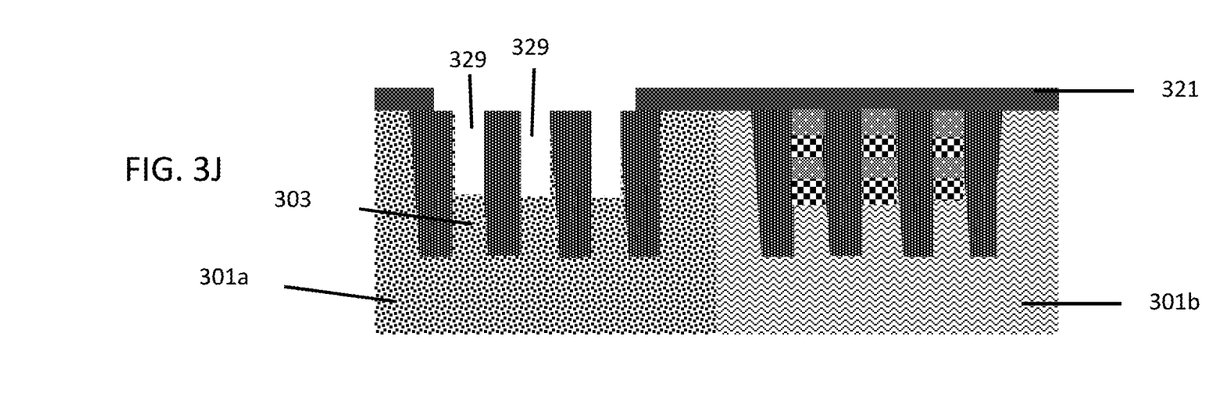
Figure 3K:
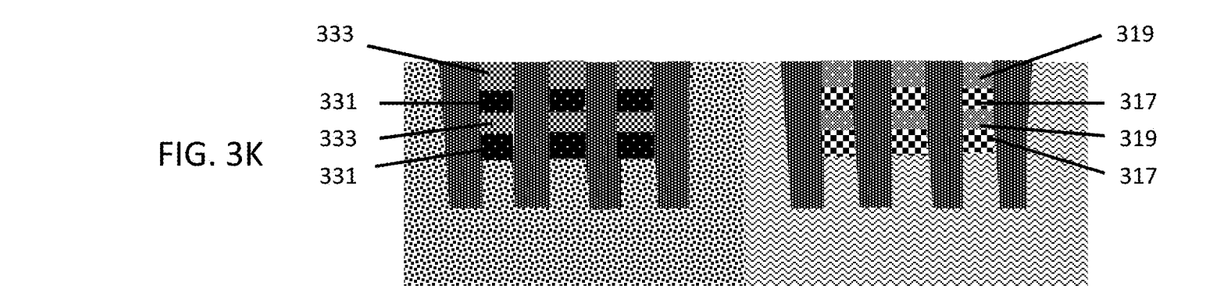

Adverting to FIG. 3J, fins 303 in substrate region 301a are etched back to form recessed regions 329. In FIG. 3K, a nanowire or nanosheet stack is formed in recessed regions 329. The nanowire or nanosheet stack is composed of alternating layers of sacrificial SiGe layers 331 and Si nanowire or nanosheet material 333. The Si nanowire or nanosheet material 333 can include Si or SiGe. The sacrificial SiGe layers 331 have a higher Ge % than the Ge present in nanowire or nanosheet material 319. As one example the nanowire or nanosheet stack in region 301a can be for a PFET device and the nanowire or nanosheet stack in region 301b can be for a NFET device. The nanowire or nanosheet material 333 used in region 301b can be the same or different from 301a. The hardmask 321 is subsequently removed. Following the nanowire or nanosheet stack growth, additional processing such as dummy gate formation, S/D junction formation, dummy gate removal, nanowire or nanosheet release and HKMG stack formation can be performed similar to that described above for FIGS. 1J through 1R.

Depending on the number of mask layers used with any of the foregoing embodiments, a relatively simple or fairly complex channel integration scheme for GAA nanowires or nanosheets, replacement fin or Si finFET can be achieved. Moreover, variations of the foregoing embodiments are envisioned herein. Examples of these variations include having a Si finFET and SiGe or Si fin replacement. Other examples include a replacement Si fin and replacement SiGe fin. Yet other examples include a replacement Si fin, replacement SiGe fin and multiple nanowire or nanosheet stacks. Other examples include a Si finFET, replacement SiGe fin and multiple nanowire or nanosheet stacks with the same top/bottom wires. Further examples include a Si finFET, replacement SiGe fin, and different top/bottom wires.

The embodiments of the present disclosure can achieve several technical effects, including CMOS nanowire or nanosheet device integration on the same device/die as finFETs, replacement fins and/or multiple nanowire or nanosheet stacks. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices using semiconductor fins in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming fins in a silicon (Si) substrate in first and second device regions of the Si substrate;
   forming shallow trench isolation (STI) regions in spaces between adjacent fins, wherein the STI regions comprise an oxide;
   planarizing the oxide with chemical mechanical polishing (CMP);
   forming a first hardmask over the fins and STI regions;
   removing a portion of the first hardmask over the first device region to expose upper surfaces of the fins and STI regions in the first device region;
   recessing an upper portion of the fins in the first device region;
   forming first devices over the recessed fins, wherein the first devices comprise nanowire or nanosheet stacks and wherein forming the nanowire or nanosheet stacks comprises:
      forming a first sacrificial silicon germanium (SiGe) layer over the recessed fins;
      forming a first Si nanowire or nanosheet material over the first sacrificial SiGe layer;
      forming a second sacrificial SiGe layer over the first Si nanowire or nanosheet material; and
      forming a second Si nanowire or nanosheet material over the second sacrificial SiGe layer;
   forming a second hardmask over the fins and STI regions;
   removing a portion of the second hardmask over the second device region to expose upper surfaces of the fins and STI regions in the second device region;
   recessing an upper portion of the fins in the second device region; and
   forming second devices, different from the first devices, over the recessed fins, wherein the second devices comprise fin field effect transistors (finFETs),
   wherein the first and/or second devices comprise nanowire or nanosheet devices.

2. The method according to claim 1, further comprising: forming well implants on sides of the fins.

3. The method according to claim 1, further comprising:
   forming a photoresist layer over each hardmask; and
   patterning the photoresist layer before removing the portion of the hardmask.

4. The method according to claim 1, wherein:
   forming the first devices comprises forming first nanowire or nanosheet stacks over the recessed fins in the first device region; and
   forming the second devices comprises forming second nanowire or nanosheet stacks over the recessed fins in the second device region, the first nanowire or nanosheet stacks comprising materials different from the second nanowire or nanosheet stacks.

5. The method of according to claim 4, wherein forming each of the first and second nanowire or nanosheet stacks comprises:
   forming a first sacrificial SiGe layer over the recessed fins;
   forming a first Si nanowire or nanosheet material over the first sacrificial SiGe layer;
   forming a second sacrificial SiGe layer over the first Si nanowire or nanosheet material; and
   forming a second Si nanowire or nanosheet material over the second sacrificial SiGe layer.

6. A method comprising:
   forming fins in a silicon (Si) substrate in first and second device regions of the Si substrate;
   forming shallow trench isolation (STI) regions in spaces between adjacent fins;
   forming a first hardmask over the fins and STI regions;
   removing a portion of the first hardmask over the first device region to expose upper surfaces of the fins and STI regions in the first device region;
   recessing an upper portion of the fins in the first device region;
   forming first devices by forming a replacement fin growth over each recessed fins in the first device region;
   forming a second hardmask over the fins and STI regions;
   removing a portion of the second hardmask over the second device region to expose upper surfaces of the fins and STI regions in the second device region;

recessing an upper portion of the fins in the second device region; and forming second devices, different from the first devices, over the recessed fins, by forming nanowire or nanosheet stacks over the recessed fins in the second device region, wherein the first and/or second devices comprise nanowire or nanosheet devices.

7. The method of according to claim 6, wherein forming the nanowire or nanosheet stacks comprises:

forming a first sacrificial SiGe layer over the recessed fins;

forming a first Si nanowire or nanosheet material over the first sacrificial SiGe layer;

forming a second sacrificial SiGe layer over the first Si nanowire or nanosheet material; and forming a second Si nanowire or nanosheet material over the second sacrificial SiGe layer.

8. A method comprising:

forming fins in a silicon (Si) substrate in first and second device regions of the Si substrate;

forming shallow trench isolation (STI) regions in spaces between adjacent fins;

forming a first hardmask over the fins and STI regions;

removing a portion of the first hardmask over the first device region to expose upper surfaces of the fins and STI regions in the first device region;

recessing an upper portion of the fins in the first device region;

forming first devices over the recessed fins;

forming a second hardmask over the fins and STI regions;

removing a portion of the second hardmask over the second device region to expose upper surfaces of the fins and STI regions in the second device region; and forming second devices, different from the first devices, over the recessed fins, wherein the first and/or second devices comprise nanowire or nanosheet devices, wherein each nanowire or nanosheet device includes a nanowire or nanosheet stack formed as an upper portion of the fins, each nanowire or nanosheet stack comprising:

a first sacrificial SiGe layer formed over the fins;

a first Si nanowire or nanosheet material formed over the first sacrificial SiGe layer;

a second sacrificial SiGe layer formed over the first Si nanowire or nanosheet material; and a second Si nanowire or nanosheet material formed over the second sacrificial SiGe layer.

* * * * *